United States Patent [19]
Mueller

[11] 3,939,427
[45] Feb. 17, 1976

[54] AUTOMATIC FINE TUNING DEFEAT CIRCUIT

[75] Inventor: David J. Mueller, Northlake, Ill.

[73] Assignee: Quasar Electronics Corporation, Franklin Park, Ill.

[22] Filed: Aug. 5, 1974

[21] Appl. No.: 494,637

[52] U.S. Cl............................. 325/418; 178/5.8 AF
[51] Int. Cl.² ............................................. H04B 1/16
[58] Field of Search ................. 325/464, 416–420, 325/422, 423, 453, 459, 468–471, 457; 178/5.8 AF, 5.8 A, 5.8 R, DIG. 15; 334/11–16

[56] References Cited
UNITED STATES PATENTS

| | | | |
|---|---|---|---|
| 3,343,092 | 9/1967 | Davids et al. | 325/423 |
| 3,619,492 | 11/1971 | Evans | 325/422 |
| 3,631,349 | 12/1971 | Rhee | 325/422 |
| 3,743,944 | 7/1973 | Bridgewater | 325/471 |
| 3,764,916 | 10/1973 | Merrell | 178/5.8 AF |
| 3,806,817 | 4/1974 | Uchida | 325/464 |

Primary Examiner—George H. Libman
Assistant Examiner—Jin F. Ng
Attorney, Agent, or Firm—LaValle D. Ptak

[57] ABSTRACT

An automatic fine tuning defeat circuit disables the application of an automatic fine tuning or automatic frequency control correction voltage to the voltage-controlled tuners of a television receiver during switching from one channel to another. The tuning voltage for a selected channel is coupled in series with the automatic frequency control voltage to provide a composite tuning voltage for the tuners. During a channel change, a switch is rendered conductive to shunt or short-circuit the output of the automatic frequency control circuit, thereby rendering its output ineffective for control of the tuners during channel change. Upon completion of the channel change, the automatic frequency control circuit output voltage again is applied in series with the tuning voltage to form the composite tuning voltage for the tuners.

12 Claims, 1 Drawing Figure

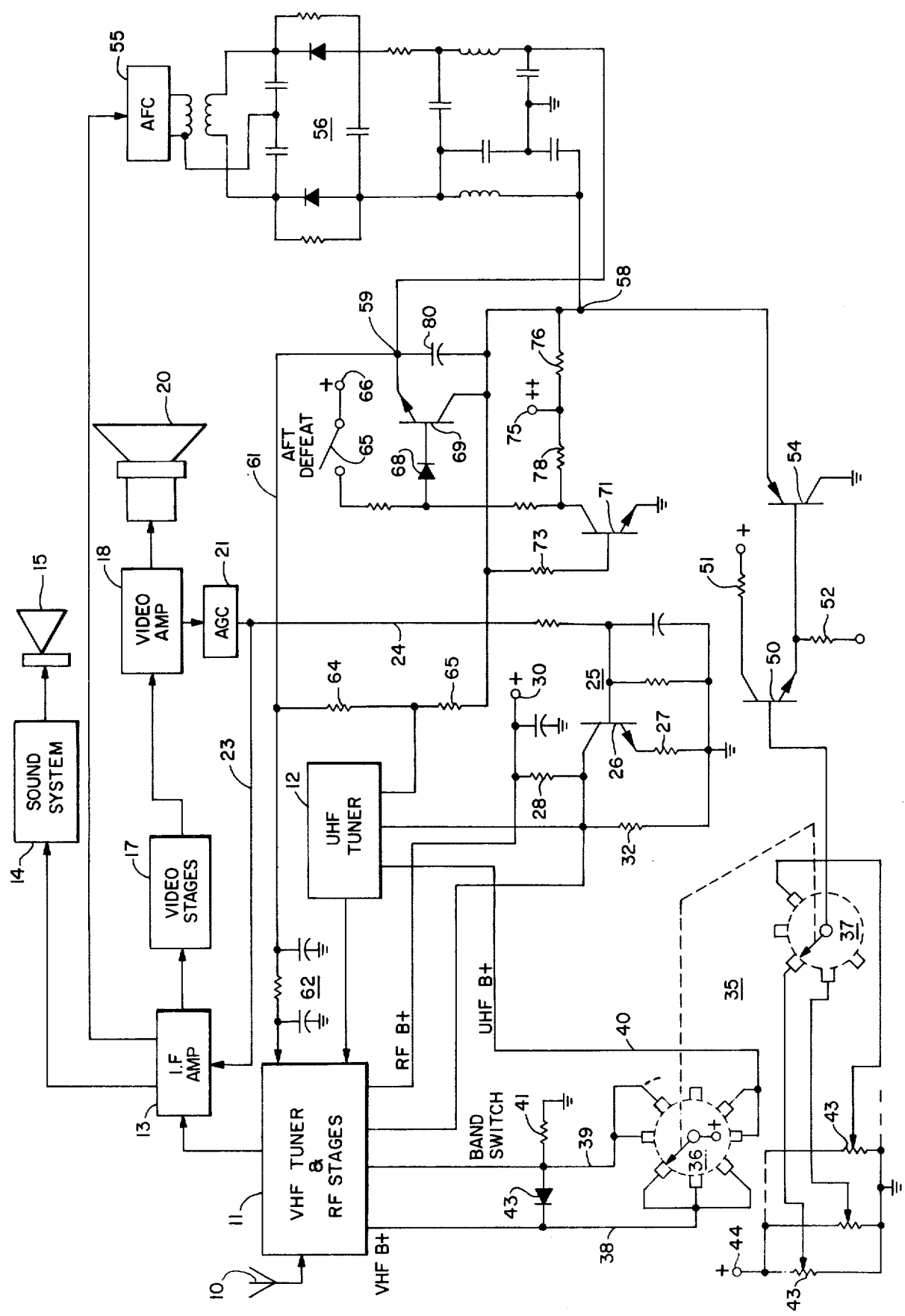

AUTOMATIC FINE TUNING DEFEAT CIRCUIT

BACKGROUND OF THE INVENTION

Most television receivers include automatic frequency control (AFC) or automatic fine tuning (AFT) systems for maintaining the fine tuning of the receiver for a selected channel during the operation of the receiver, thereby improving the quality of the received picture. These systems are particularly desirable in color television receivers where relatively slight mistuning can result in a loss of the color portion of the picture or in distortion of the color portion.

A problem exists with AFC or AFT systems, however, during changing of the tuning of the receiver from one channel to another. It is possible for the AFC circuit to lock to a frequency other than the desired frequency for the new channel, and no useable picture or sound will be reproduced. This condition is called "lock-out". Because of this, it is often desirable to disable the AFC circuits during channel change. In the past this has been accomplished by an AFC defeat switch operated by the mechanical motion of the television tuner shaft during the channel change. Other techniques used with remote control receivers have sensed the operation of the remote control tuning motor to defeat or remove the AFC voltage during the channel changing.

The advent of electronic tuning, however, has resulted in a situation where mechanical motion is not necessarily present during a channel change. Electronic tuning systems can use rotary switches similar to those previously used in television receivers for effecting channel change, but this is not necessary. As a consequence, it is desirable to disable the AFC or AFT circuit during channel change in an electronically tuned receiver in response to a condition of the tuning voltage which occurs during such channel change. Then AFC defeat would not be dependent upon mechanical movement for its operation, but would operate directly in response to the condition of the tuning voltage for the receiver.

SUMMARY OF THE INVENTION

Accordingly, it is an object of this invention to provide an improved system to disable the automatic frequency control circuit of a wave signal receiver during changes in the tuning of the receiver.

It is an additional object of this invention to provide an improved automatic frequency control defeat system.

It is another object of this invention to provide an improved tuning system for an electronically tuned receiver.

It is a further object of this invention to provide an AFC defeat system which is operated in response to variations in the tuning voltage for an electronically tuned receiver.

In accordance with a preferred embodiment of this invention an AFC defeat system for the voltage responsive tuner stages of a television receiver operates to supply the tuning voltage and the automatic frequency control voltage in series to form a composite tuning voltage for the tuner under normal conditions of operation. When selection of a new channel is being effected, the tuning voltage changes to a predetermined value and causes a shunting switch connected across the output of the AFC circuit to be rendered conductive, thereby effectively removing the AFC voltage from the composite voltage applied to the tuner. As soon as a normal tuning voltage is again supplied by the tuning voltage supply circuit, the shunting switch is rendered nonconductive; and the AFC voltage once again is combined with the tuning voltage to form the composite tuning voltage.

BRIEF DESCRIPTION OF THE DRAWING

The sole FIGURE of the drawing is a schematic diagram, partially in block form, of a preferred embodiment of the invention.

DETAILED DESCRIPTION

Referring now to the drawing, there is shown a television receiver including an antenna 10 for receiving transmitted television signals. The antenna 10 is coupled with a circuit 11 including the VHF tuner and RF stages of the receiver. A UHF tuner 12 also is coupled with the RF stages of the circuit 11 and tuning of the receiver is accomplished by the tuner components of the stages 11 and 12 in accordance with tuning selection of either a VHF or UHF channel.

The intermediate frequency (IF) signals from the stage 11 are supplied to an IF amplifier 13 which provides sound signals to a sound system 14 for conventional processing and amplification, with the sound being reproduced by a loudspeaker 15. The video signals from the IF amplifier 13 also are supplied in a conventional manner to video stages 17 of the television receiver, are amplified by a video amplifier 18, and are reproduced as pictures in a cathode ray tube 20, which may be either a black and white or color television cathode ray tube.

It is conventional in most television receivers to employ an automatic gain control (AGC) circuit 21, and the AGC circuit 21 responds to the signal variations from the video amplifier 18 to produce an AGC control voltage which is applied back to the IF amplifier 13 over a lead 23. The AGC voltage also is applied over a lead 24 to the base of a transistor 26 in an amplifier circuit 25. The emitter of the transistor 26 is connected through an emitter resistor 27 to ground and its collector is connected through a collector load resistor 28 to a source of B+ potential on a terminal 30. The terminal 30 also is connected to the circuit 11 to supply the RF B+ potential for the RF stages of the circuit 11. The AGC voltage for the circuit 11 and the UHF tuner 12 is obtained from the collector of the transistor 26 and appears across a resistor 32 connected between the collector of the transistor 26 and ground.

The television receiver circuit which has been described thus far is representative of a conventional television receiver and also can include other conventional functions which have not been illustrated.

The VHF and UHF tuners of the stages 11 and 12 are conventional electronically tuned tuners. That is, these tuners operate in response to a varying DC control voltage to establish tuning to a selected channel. Typically, such tuners employ varactor diodes or voltage variable capacitors as the tuning elements. The particular channel to which the receiver is being tuned is dependent upon whether the VHF or UHF tuner is operative and also is dependent upon the magnitude of the tuning voltage applied to the operative tuner.

Channel selection is illustrated as accomplished under control of a wafer switch 35 having two contact banks 36 and 37. Each bank has fixed contacts equal in number to the number of channels which can be selected by the receiver, and each bank 36, 37 has a single moveable wiper contact. As shown, the wiper contacts for the banks 36 and 37 are ganged to move together. Not all of the fixed contacts necessary for a television receiver capable of receiving all of the VHF and UHF channels have been shown on the switch 35, since to show such a large number of contacts merely would unnecessarily clutter the drawing. It is to be understood, however, that the banks 36 and 37 of the switch 35 do include fixed contacts for each of the channels which the receiver is capable of receiving.

The fixed contacts of the bank 36 of the switch 35 are interconnected together in three groups corresponding (1) to the low-band VHF channels, the contacts for which are coupled in common to a lead 38; (2) the high-band VHF channels, the fixed contacts of which are coupled in common to a lead 39; and (3) the UHF channels, the fixed contacts of which are coupled in common to a lead 40. The moveable wiper contact of the switch bank 36 is coupled to a source of positive (B+) potential; so that whenever the wiper engages one of the fixed contacts of the bank 36, that fixed contact and only that fixed contact of the bank 36 has B+ potential applied to it.

Whenever a low-band VHF channel is selected, the lead 38 has B+ potential applied to it. This enables for operation the VHF tuner stages of the receiver; and since the potential on the lead 39 at such time is a negative potential, as applied through a resistor 41, the band switch for the VHF tuner selects the low-band range of the tuner. Similarly, when the moveable contact of the bank 36 engages any one of the fixed contacts connected to the lead 39, B+ potential is applied to the lead 39. This then causes a B+ potential rather than a negative potential to be applied to the band switch input to the VHF tuner to select its high-band range. A coupling diode 43 also applies this B+ potential to the VHF B+ lead 38.

Thus, whenever either a low-band or a high-band VHF channel is selected, B+ potential is present on the lead 38. When a low-band VHF channel is selected, the lead 39 is at a low or negative potential. When a high-band VHF channel is selected, the lead 39 is at a high or positive potential and this can be sensed by conventional band switching circuitry within the VHF tuner stages of the circuit 11.

In a similar manner, whenever the moveable wiper of the band 36 of the switch 35 engages one of the fixed contacts connected to the UHF lead 40, B+ potential is applied to the UHF tuner to energize that tuner for supplying the signals to the RF stages of the circuit 11. At the same time, no positive potential appears on either of the leads 38 or 39; so that the VHF B+ signal is removed, thereby disabling the VHF tuner portion of the circuit 11.

For each channel, a tuning potentiometer 43 is provided and is connected between a source of B+ potential, applied on a terminal 44, and ground. The taps on the potentiometers 43 are each connected to a different one of the fixed contacts of the bank 37 of the switch 35. There is a potentiometer 43 and a fixed contact on the switch bank 37 for each of the VHF and UHF channels which the receiver is capable of receiving. The fixed contacts on the switch banks 36 and 37 are interrelated with one another to tune the desired station in the proper band for each of the positions of the switch 35.

The tuning voltage present on the tap of the selected potentiometer is applied through the wiper contact of the switch bank 37 to the base of an NPN emitter-follower transistor 50, the collector of which is connected to a source of positive potential (not shown) through a resistor 51, and the emitter of which is connected to a source of negative potential (not shown) through an emitter resistor 52. The conductivity of the transistor 50 varies according to the voltage which is applied to it from the selected potentiometer 43. This voltage is intermediate the voltages applied to its collector and emitter electrodes. The emitter-follower transistor 50 has an input impedance which is several megohms to reduce the loading on the potentiometers 43 as much as possible. The emitter of the transistor 50 is connected to the base of a PNP emitter follower transistor 54, the collector of which is connected to ground and the emitter of which is connected to a B++ voltage supply terminal 75 through a resistor 76. The voltage on the emitter of the transistor 54 comprises the desired tuning voltage for application to the VHF and UHF tuner stages 11 and 12.

As is common with most television receivers, the receiver shown in the drawing includes an automatic frequency control (AFC or AFT) circuit 55 which responds to the IF frequency from the IF amplifier 13. The AFC circuit 55 supplies the amplified IF signal to a conventional frequency discriminator 56, which has a pair of output terminals 58 and 59, floating with respect to ground. This permits the output of the discriminator to vary between positive and negative voltages (typically plus or minus 0 to 1.6 volts DC), causing the AFC circuit connected between the terminals 58 and 59, to appear as either a positive or negative battery or varying voltage depending upon the degree of mistuning sensed by the AFC circuit 55, 56.

The output terminals 58 and 59 of the AFC discriminator 56 are connected in series circuit with the emitter follower transistor 54 to supply a composite tuning voltage to the tuners 11 and 12. This series path extends from the emitter of the transistor 54, the terminal 58, the AFC discriminator 56, the terminal 59 over a lead 61 to the VHF tuner stages of the circuit 11 through an RC filter 62.

Since the change in frequency for a given change in voltage for the UHF tuner typically is larger than the frequency change for the same change in voltage for a VHF tuner, the AFC correction voltage appearing between the terminals 58 and 59 is divided down by a voltage divider comprising a pair of resistors 64 and 65 to reduce the amount of AFC pull-in on the UHF tuner 12. The junction between the resistors 64 and 65 is coupled to the UHF tuner 12 to supply this divided down AFC voltage to it.

The operation of the circuit under a steady-state condition where it is tuned to a channel is such that the tuning voltage present on the emitter of the transistor 54 is applied over the lead 61 to the VHF and UHF tuners 12 in series with the AFC voltage appearing across the terminals 58 and 59. This AFC voltage can either add to, subtract from, or not change at all the tuning voltage on the emitter of the transistor 54 depending upon the tuning variations which take place at any given instant of time.

Most television receivers include a manually operated circuit for defeating the AFC circuit to permit initial fine tuning adjustments of the receiver or the like. Such an AFC defeat switch 65 is shown in its normally open position and coupled to a source of positive potential (not shown) on a terminal 66. When the switch 65 is closed, the positive potential on the terminal 66 is applied through a diode 68 to the base of an NPN switch transistor 69 which has its collector-emitter path connected in shunt across the terminals 58 and 59. The transistor 69 is normally non-conductive and is rendered conductive by closure of the switch 65 to short-circuit the terminals 58 and 59. This renders the operation of the AFC discriminator circuit 56 ineffective so far as the voltage appearing on the lead 61 is concerned. Whenever the transistor 69 is conductive, the voltage on the lead 61 is solely determined by the tuning control voltage appearing on the emitter of the transistor 54 unaffected by any AFC voltages supplied by the discriminator 56. When the switch 65 is opened, the transistor 69 becomes non-conductive and normal operation of the circuit resumes.

A similar effect is obtained whenever the switch 35 is moved from one channel to another. When this occurs, the wiper of the bank 37 moves from one fixed contact to another; and in the intermediate movement, it is temporarily connected to an open circuit. This causes the transistor 50 to become non-conductive. As a result, the transistor 54 is driven hard into conduction by the negative potential applied to its base through the resistor 52, and the tuning voltage on the emitter of the transistor 54 drops to a low level. This drives a normally conductive NPN control transistor 71 non-conductive since the base of the transistor 71 is connected to the terminal 58 through a coupling resistor 73.

Whenever tuning voltages in the normal range of such voltages appear on the emitter of the transistor 54, these voltages are of sufficiently positive potential to bias the transistor 71 into conduction. The B++ potential on the terminal 75 also is supplied through a resistor 78 to the collector of the transistor 71; but when the transistor 71 is conductive, its collector is at near ground potential which reverse biases the diode 68; and the transistor 69 is non-conductive.

Between channels, however, when the wiper of the switch 37 is not engaging any of the fixed contacts of the switch bank 37, the transistor 71 becomes non-conductive. This causes the potential on its collector to rise to a point where the diode 68 is forward biased. The transistor 69 then is rendered conductive to shunt the output of the AFC discriminator 56 in the same manner as occurs when the switch 65 is closed. This condition lasts only momentarily until the moveable wiper of the switch bank 37 once again engages a fixed contact, causing a normal tuning voltage to appear on the emitter of the transistor 54. When this happens, the transistor 69 once again becomes non-conductive and resumption of AFC control takes place. This is delayed for a short time by a capacitor 80 connected across the terminals 58 and 59 to slow down the application of the AFC voltage enough to prevent the AFC circuit 55, 56 from locking on the wrong carrier when a new channel is selected.

The circuit which has been described is an effective AFC defeat or disabling circuit operating in response to the tuning voltages in an electronically tuned receiver.

I claim:

1. A system for a wave signal receiver including in combination:
    a voltage responsive tuner stage tunable to different frequencies within at least one band of frequencies in response to a tuning voltage applied thereto;
    automatic frequency control means coupled with the output of said tuner stage for producing an automatic frequency control voltage indicative of the tuning of said tuner stage;
    tuning voltage supply means for supplying a voltage;
    means for coupling said tuning voltage supply means and the output of said automatic frequency control means to said voltage responsive tuner stage to supply said tuning voltage thereto, said tuning voltage being a composite of the voltage supplied by said tuning voltage supply means and the automatic frequency control voltage from said automatic frequency control means; and
    switch means coupled to said automatic frequency control means and to said tuning voltage supply means for sensing a predetermined voltage supplied by said tuning voltage supply means, said switch means being operative in response to said predetermined voltage to remove the effect of said automatic frequency control voltage from said composite tuning voltage.

2. The combination according to claim 1 wherein the output voltage of said automatic frequency control means is floating with respect to ground and has a magnitude and polarity indicative of the tuning of said tuner stage.

3. The combination according to claim 1 wherein said switch means is normally non-conductive and is coupled in shunt across the output of said automatic frequency control means and is rendered conductive in response to said predetermined voltage.

4. The combination according to claim 3 wherein said automatic frequency control means comprises a discriminator having first and second output terminals across which said output voltage of said automatic frequency control means appears, said switch means is coupled in shunt across said output terminals of said automatic frequency control means, said tuner stage is coupled to said first output terminal, and said tuning voltage supply means is coupled with said second output terminal.

5. The combination according to claim 3 wherein said switch means comprises a transistor, the collector-emitter electrodes of which are coupled in shunt across the output of said automatic frequency control means, and the base electrode of which is coupled with said tuning voltage supply means for sensing the voltage supplied thereby, said transistor being rendered conductive in response to said predetermined voltage.

6. The combination according to claim 5 wherein said tuning voltage supply means includes a plurality of potentiometers connected across a source of potential; a wafer switch having a plurality of fixed contacts, each connected to the tap of a different one of said plurality potentiometers, and having a wiper contact connectable to only one of said fixed contacts at any given time; and said predetermined voltage is applied to said switch means when the wiper contact of said wafer switch is positioned between two of said fixed contacts, causing an open circuit to appear on said wiper contact.

7. In a television receiver, a system including in combination:
    a voltage responsive tuner stage tunable to different frequencies within at least one band of frequencies in response to a tuning voltage applied thereto;
    an automatic frequency control circuit including a discriminator having first and second output terminals floating with respect to ground for producing across such output terminals an automatic frequency control voltage having a magnitude and polarity indicative of the tuning of said tuner stage;

tuning voltage supply means coupled to one of the output terminals of said automatic frequency control circuit, the other output terminal of said automatic frequency control circuit coupled to said tuner stage, forming a series circuit supplying said tuning voltage to said tuner stage, said tuning voltage being a composite of a voltage supplied by said tuning voltage supply means and said automatic frequency control voltage from said automatic frequency control circuit;

a normally nonconductive transistor switch, the emitter-collector path of which is connected across said first and second output terminals of said discriminator and the base of which is coupled to the output of said tuning voltage supply means for sensing a predetermined voltage supplied thereby, said transistor switch rendered conductive in response to said predetermined voltage to shunt the output terminals of said automatic frequency control discriminator, rendering the automatic frequency control voltage ineffective while said transistor switch is conductive.

8. The combination according to claim 7 further including a capacitor coupled in parallel with the emitter-collector path of said transistor switch across said first and second output terminals of said automatic frequency control discriminator for delaying the application of said automatic frequency control voltage for a predetermined time after said transistor switch is rendered nonconductive after being conductive.

9. The combination according to claim 8 further including a control transistor, the collector of which is coupled through a collector resistor to a source of operating potential, the emitter of which is coupled with a point of reference potential, and the base of which is coupled to the output of said tuning voltage supply means, the base of said transistor switch being coupled with the collector of said control transistor, and said control transistor being rendered conductive in response to the presence of a tuning voltage on the output of said tuning voltage supply means to thereby render said transistor switch nonconductive, and said control transistor being rendered nonconductive in response to the absence of a tuning voltage from said tuning voltage supply means to render said transistor switch conductive.

10. The combination according to claim 9 wherein said transistor switch and said control transistor are of the same conductivity type.

11. The combination according to claim 10 wherein said transistor switch and said control transistor both are NPN transistors, said point of reference potential is ground potential, said source of operating potential is a positive potential, and the collector of said transistor switch and the base of said control transistor are coupled with the output of said tuning voltage supply means.

12. The combination according to claim 11 wherein the base of said transistor switch is coupled through a diode with the collector of said control transistor, said diode preventing emitter-base breakdown of said transistor switch when it is nonconductive.

* * * * *